(12) United States Patent
Limp et al.

(10) Patent No.: US 9,563,264 B1
(45) Date of Patent: Feb. 7, 2017

(54) COVER WITH DEVICE CONDITION INDICATION

(71) Applicant: Amazon Technologies, Inc., Reno, NV (US)

(72) Inventors: David A. Limp, Medina, WA (US); Nathan Brent Glissmeyer, Seattle, WA (US); Peter A. Larsen, Seattle, WA (US); Peter John Thomas Johnson, Seattle, WA (US); Jason John Marine, Seattle, WA (US); Jeffrey Robinson Wood, Mountain View, CA (US)

(73) Assignee: Amazon Technologies, Inc., Seattle, WA (US)

( * ) Notice: Subject to any disclaimer, the term of this patent is extended or adjusted under 35 U.S.C. 154(b) by 171 days.

(21) Appl. No.: 13/925,516

(22) Filed: Jun. 24, 2013

(51) Int. Cl.
  *H05K 5/00* (2006.01)
  *G06F 3/01* (2006.01)
  *H05K 7/00* (2006.01)

(52) U.S. Cl.
  CPC ........ *G06F 3/01* (2013.01); *H05K 5/00* (2013.01); *H05K 7/00* (2013.01)

(58) Field of Classification Search
  CPC ................. G06F 1/1647; G06F 3/1423
  See application file for complete search history.

(56) References Cited

U.S. PATENT DOCUMENTS

| | | | |
|---|---|---|---|
| 2010/0141689 A1* | 6/2010 | Johnson | 345/690 |
| 2010/0216518 A1* | 8/2010 | McPhail et al. | 455/567 |
| 2010/0222110 A1* | 9/2010 | Kim et al. | 455/566 |
| 2011/0260864 A1* | 10/2011 | Dearborn et al. | 340/540 |
| 2013/0157655 A1* | 6/2013 | Smith et al. | 455/426.1 |
| 2013/0281169 A1* | 10/2013 | Coverstone | H04M 1/0283 455/575.8 |
| 2014/0068755 A1* | 3/2014 | King | G06F 21/53 726/19 |
| 2014/0204511 A1* | 7/2014 | Oh | G06F 1/1632 361/679.01 |

\* cited by examiner

*Primary Examiner* — Lixi C Simpson
(74) *Attorney, Agent, or Firm* — Lee & Hayes, PLLC (57) ABSTRACT

A cover may be used in conjunction with a handheld device for physical protection of the handheld device. The cover may have an indicator that is responsive to a signal provided by the handheld device to display different colors or other visual states depending on conditions of the handheld device such as security modes, user modes, and so forth.

22 Claims, 5 Drawing Sheets

COVER WITH DEVICE CONDITION INDICATION

BACKGROUND

A large and growing population of users is enjoying entertainment through the consumption of digital media items, such as music, movies, images, electronic books, and so on. The users employ various electronic devices to consume such media items. Among these electronic devices are electronic book readers, cellular telephones, personal digital assistant (PDA), portable media players, tablet computers, netbooks, and the like.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

DETAILED DESCRIPTION

This disclosure describes an accessory that may be used with a handheld electronic device, such as a cellular telephone or smartphone, a personal digital assistant (PDA), a portable media player, a tablet computer, a netbook, a laptop computer, an electronic book ("eBook") reader device, etc. In one example, the accessory is a cover is for a handheld electronic device, such as a tablet device. The cover is capable of displaying or presenting different colors or other characteristics (e.g., different patterns, graphics, etc.) to indicate different operational conditions of the tablet device. Different colors may be used to differentiate between different device users or owners, for example. Different cover colors may also be used to notify users of events such as reminders. As another example, a cover device may be configured to display a particular color when a corporate security policy has been implemented by the tablet device. As yet another example, the cover may display different colors depending on the owner or current user of the device.

In one embodiment, as another example, the tablet device is capable of running in a protected mode in which content and/or activities available through the tablet device are customized and/or restricted for children or other types of users. When the tablet device is running in protected mode, the cover may be configured to display a particular, easily recognizable color. This allows parents and other observers to easily confirm that the tablet device is configured properly, and that safeguards are in place to prevent users of the device from accessing inappropriate or unauthorized content. Of course, while one example is provided, it is to be appreciated that the device may be configured to run in other modes(s), with the cover being configured to display respective colors, each of which correspond to a respective mode of the device.

Figure 1:
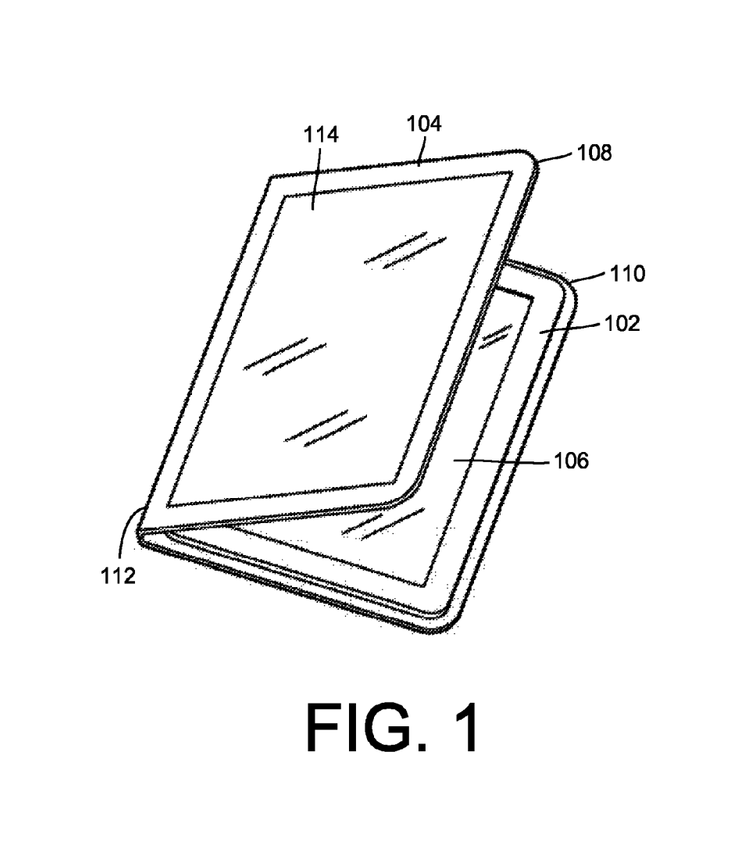
FIG. 1 is a perspective view of a first handheld device and accompanying cover that indicate conditions or modes of the handheld device.

FIG. 1 shows a tablet device 102 and an example cover accessory 104 for the tablet device 102. In the described example, the tablet device 102 is a general-purpose tablet computer having a touch-sensitive color display 106 through which a user can provide input. The tablet device 102 is capable of presenting audio and visual content to a user, and may have network connectivity for accessing Internet content or other network-based content. Visual content, including both local and network-based content, may be displayed on the display 106 of the tablet device 102. Visual content may include text, graphics, and games. Audio contain may include music, audio books, podcasts, and so forth. Content available on the device 102 may include movies or other video, which may include accompanying audio. Content may also be generated by applications that execute on the device 102.

In some embodiments, the tablet device 102 may comprise a dedicated eBook reader, which is optimized for displaying books and other textual content. A dedicated eBook reader may use a low-power black-and-white display (e.g., a electronic ink display) to more closely emulate the traditional reading experience. In some embodiments, user input may be provided through buttons and other controls other than a touch-sensitive display surface.

Although the cover is illustrated and described below in conjunction with a tablet device, covers or other accessories such as described herein may be used with other types of handheld devices, such as smartphones, media players, laptop computers, and various other devices having a variety of form factors.

In the illustrated embodiment, the cover 104 has a front flap 108 and a back 110. The tablet device is detachably secured to the back 110. The front flap 108 is flexibly hinged to the back 110 by a spine or hinge 112 so that the front flap 108 can move from a closed position, in which the front flap 108 covers the tablet display 106, to an open position in which the tablet display 106 is visible to a user. In some embodiments, the front flap 108 may be opened and folded around behind the back 110 during use. The front flap 108 may have one or more magnets for holding the front flap 108 in an open or closed position. The cover 104 may be constructed as a single foldable component, or may be constructed from multiple parts or pieces that are joined by various means such as stitches, seams, adhesives, and so forth, The cover 104 has a light source or indicator 114 that is capable of responding to conditions of the tablet device 102 by present or display different characteristics such as patterns, two-dimensional graphic pictures or images, haptic feedback, tactile indications, colors, or sequences of patterns and/or colors. The characteristics may be presented when the associated device 102 is being used, as well as when the device 102 is idle or is not being actively used.

As an example, the indicator 114 may comprise a display panel such as an LCD panel, color e-ink panel, or other surface that can be configured to change colors in response to different operational modes of the tablet device 102.

Alternatively, the indicator 114 may be any other type of element or material that is capable of generating, radiating, or retransmitting different colors. Although the indicator 114 is illustrated in FIG. 1 as a large rectangular area, the indicator 114 may be of any other shape or size, and may be positioned at different locations on the cover 104. In some cases, the indicator 114 may occupy all or nearly all of the inner or outer surfaces of the front flap 108 and/or the back flap 110. In other cases, the indicator 114 may comprise one or more point light sources such as LEDs (light-emitting diodes) which may occupy a smaller area and which may be positioned on any surface of the cover 104.

In some embodiments, the indicator 114 may comprise an element or area that displays or generates a single color, pattern, or other visible characteristic across or along its entire extent at any given time. For example, the entire indicator 114 may be configured to display a single monochromatic color at any time, such as blue or pink.

More specifically, the indicator 114 may comprise a single display element having a monochromatic color or pattern that is controlled as a whole rather than by controlling individual sub-elements or sub-portions of the display element. Accordingly, although the indicator may not be capable of or configured to convey detailed information such as text or graphics, it can be used to signal higher-level status and conditions such as general operational conditions and/or modes of the device 102.

In other embodiments, the indicator 114 may comprise a two-dimensional array of display elements or pixels that can be configured to display graphical images such as pictures, drawings, and other visual images. Different operating modes may be indicated by displaying different pictures or images on the indicator 114. Images may in some embodiments be provided as a part of a theme that is selected by the user of the device 102. In some cases, users may subscribe to receive various types of pictures and images for display on the indicator 114 in response to different operating modes of the device 102.

In some embodiments, the indicator 114 may include the entire cover 104, or larger portions of the cover 104 such as the entire front flap 108. In some embodiments, for example, the cover 104 may be made in part or in whole from a material that is capable of changing its color in response to electrical stimuli. In embodiments such as this, the entire cover may change from one color to another color in response to different operating modes or conditions of the tablet device 102.

In other embodiments, the indicator 114 may comprise a light-conductive element or material that conducts light that has been generated by the device 102. For example, the indicator 114 may comprise a translucent or other light-conducting material that radiates light generated by the display 106 of the device 102. In an example such as this, the device 102 may detect that the cover 104 is in its closed position, and may configure a portion of its display 106 to display a particular color to indicate an operating condition of the device 102. The displayed color may be radiated or conducted through the translucent indicator 114, so that it is visible to users or other observers of the cover 104. Various types of light-conductive materials may be used to direct light from the device 102 for display on the cover 104 in various locations and/or areas.

The tablet device 102 is capable of operating under different conditions. In the example of FIG. 1, the cover 104 is configured to change its color or the color displayed by its indicator 114 in response to different operating conditions. For example, the cover 104 or the indicator 114 of the cover 104 may change to a particular color, such as blue, when the tablet device 102 is operating in protected mode. At other times, the cover 104 or the indicator 114 may display a different color, such as black, grey, or white.

As an example of device conditions, the device 102 may be operated for different users, or under different user profiles or modes. Specifically, different users of a device may have respectively corresponding user profiles, which may be activated by logging in to the device. A user profile defines a user experience, including such things as settings, preferences, configurations, accounts, context, history, and so forth for a particular user. A user may provide login information and/or security credentials in order to access or operate a device under a particular user profile. Once a user is logged in to the device 102, the cover may respond by displaying a color that has been chosen by the user.

As another example of operating conditions, the device 102 may be capable of operating under different security profiles or modes. A security mode may define content, operations, and/or activities that are allowed on the device 102 and/or that are allowed to be performed by the device 102. In some cases, different security modes may be associated respectively with each of multiple users.

As yet another example of operating conditions of the device 102, the device 102 may be capable of a protected mode that restricts access to certain content. For example, a device operating in a protected mode may be limited to providing or presenting content only from a predefined corpus of preapproved content. In some embodiments, the protected mode may be an example of a security mode, and may comprise one of multiple security modes. Generally, a tablet or device running in protected mode restricts the content that is available for presentation to the user and/or restricts the activities or functions that may be performed by the device.

Operating conditions may correspond to different users or user characteristics. For example, the cover may display different colors that correspond respectively to different users of the device 102. When one user is using the device 102 the cover 104 may display a first color, and when another user is using the device 102 the cover 104 may display a second color. As another example, the cover 104 may display different colors based on characteristics of the current user. Thus, the cover 104 may display a first color, such as blue, when a boy is using the device 102, and may display a second color, such as pink, when a girl is using the device 102. In this instance, the cover may additionally or alternatively display a graphic corresponding to a boy when a boy is using the device 102 and a graphic corresponding to a girl when a girl is using the device.

As another example, the device 102 and cover 104 may be configured to display a color corresponding to the owner of the device 102. Thus, owners of different devices within a household may configure their devices to select different cover colors, so that the devices can be easily distinguished.

As yet another example, the device 102 and cover 104 may be configured to display a color to indicate events, such as notifications or reminders, that are generated by the device 102. Notifications may include the receipt of email or other messages, or may indicate that certain activities are being performed by the device 102.

Generally, the displayed color of the cover 104 may be used to indicate various operating conditions of the device 102, including but not limited to any one or more of the following:
    an owner of the handheld device;
    a user who is using the handheld device;

a characteristic of a user who is using the handheld device;

a user mode that is active on the handheld device;

a security mode that is active on the handheld device;

an event notification or reminder generated by the handheld device;

an activity being performed by the handheld device;

an application being executed by the handheld device;

content that is being presented by the handheld device;

a source that is being accessed by the handheld device;

a service that is being provided in conjunction with the handheld device;

awards granted to the user such as awards from games;

achievements of the user such as learning progress or achievement levels of a game;

connection status of device peripherals such as wireless headsets;

call status; or battery level.

Figure 2:
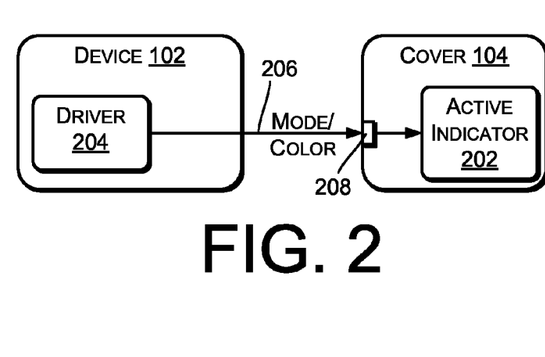
FIGS. 2 and 3 are block diagrams showing different configurations of handheld devices and associated covers.

FIG. 2 shows an example configuration of the device 102 and the cover 104. In this configuration, the cover 104 has an active indicator or light source 202 that actively generates and displays light and/or other characteristics that are perceivable to observers of the cover 104. User-perceivable characteristics may include colors; patterns; two-dimensional graphics, images, or pictures; sounds; haptic indications such as vibrations; tactile indications or tactile writing such as Braille; and so forth.

The active indicator 202 may be an LED (light-emitting diode) or other light, a color display panel such as the display panel 114 shown in FIG. 1, an LED-based or neon-based light string or light rope, or any other element or material capable of presenting two or more different colors, on/off states or other user-perceivable characteristics. Visual characteristics may include colors, color patterns, sequences of colors or patterns, two-dimensional images or pictures, etc.

The active indicator 202 may occupy a point or small area of the cover 104, or may occupy a relatively large portion of the cover 104 such as substantially all of the outer and/or inner surfaces of the cover 104. In some cases, the cover may be constructed from a sheet-like material that is capable of changing its color, such as a color e-ink display, flexible display, etc., and the active indicator 102 may comprise all of the cover 104 or significant portions of the cover 104 such as the front flap 108 of the cover 104.

The device 102 may include a driver 204 that provides a signal 206 to the cover 104. The cover 104 may have a signal receiver 208, such as an electrical connector or active electrical component that receives the signal 206 and provides the signal to the active indicator 202. The signal 206 may indicate a current operating condition of the device 102. In some cases, the current operating condition may be specified by indicating the color or other user-perceivable characteristics that are to be presented or displayed by the cover 104.

The signal 206 may be an electrical signal, provided by an electrical connector or connection between the device 102 and the cover 104. Alternatively, the signal 206 may comprise a wireless signal such as an RFID signal, a Bluetooth™ signal, or different type of wireless signal. In some embodiments, the signal 206 may convey data such as graphics or pictures that are to be displayed on the indicator 202.

The active indicator 202 may include electronics and/or control logic for receiving the signal 206 and for controlling the displayed color of the cover 104 in response to the signal 206. In some cases, the cover 104 may include programmable logic, such as a processor and memory, for controlling the active indicator 202 in response to the signal 206. The cover 104 may in some embodiments have an integral rechargeable or replaceable battery to power the logic and active indicator 202 of the cover 104. In other embodiments the cover 104 may receive power from the device 102.

In some embodiments, the cover 104 may be attached to a handheld device other than the device 102 from which the signal 206 is received. For example, a first handheld device may belong to a parent, and may be attached to the cover 104. The cover 104 may be configured to receive the signal 106, which may comprise a wireless signal, from a second handheld device that is used by a child. The signal 206 may indicate the operating mode of the child's handheld device, and the cover 104 may display a color corresponding to the operating mode of the child's device. This configuration may be used by a parent to provide a convenient means of confirming that the child's device is operating in an appropriate mode, such as a content-restricted mode.

Figure 3:
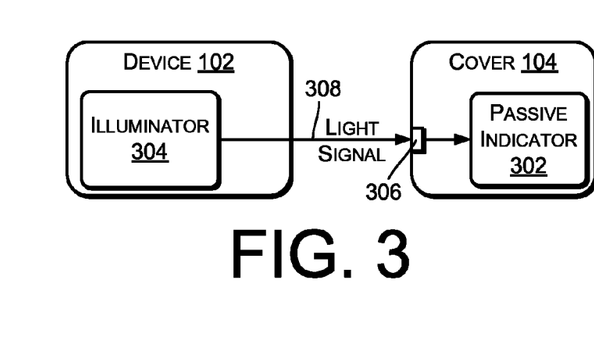

FIG. 3 shows another example configuration of the device 102 and the cover 104. In this configuration, the cover 104 has a passive light indicator 302 that directs and radiates light emitted from an active indicator or light source 304 that is part of the device 102. For example, the light source 304 may comprise one or more LEDs or other light sources that are capable of generating different colors of light. An optical coupling or connector 306 such as a light guide may be provided between the device 102 and the cover 104 to convey a light signal 308 from the device 102 to the cover 104. The light signal 308 comprises light of the color generated by the light source 304 of the device 102.

The passive indicator 302 may comprise an light-emitting optical guide such as an optical fiber that receives the light signal 308 and that radiates the received light signal 308 in a manner that is visible to observers of the cover 104. For example, the passive indicator 302 may comprise a side-emitting or end-emitting optical fiber that is positioned on the cover 104 to radiate the received light signal.

Figure 4:
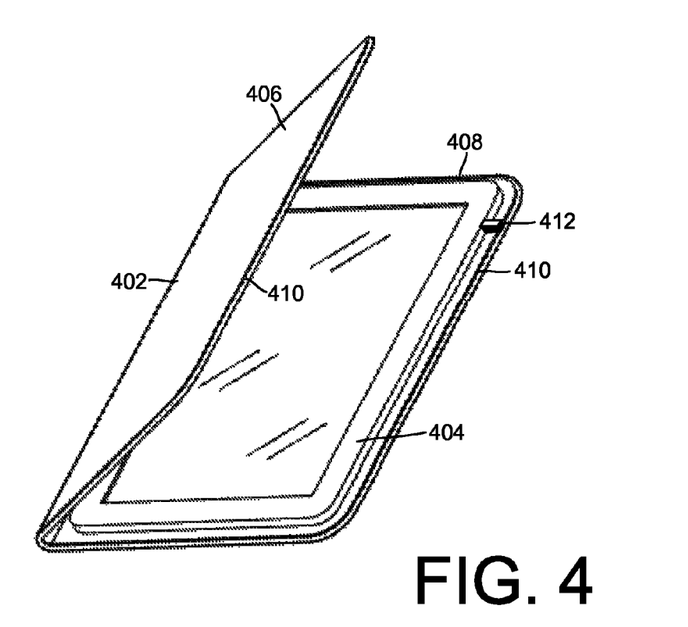
FIGS. 4 through 6 are perspective views of a second handheld device and associated cover that indicate conditions or modes of the handheld device.
Figure 5:
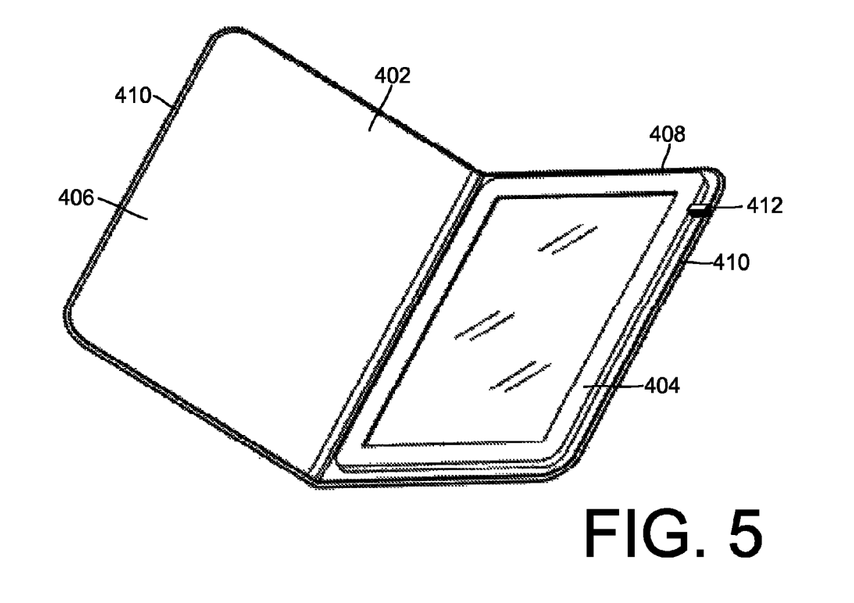
Figure 6:
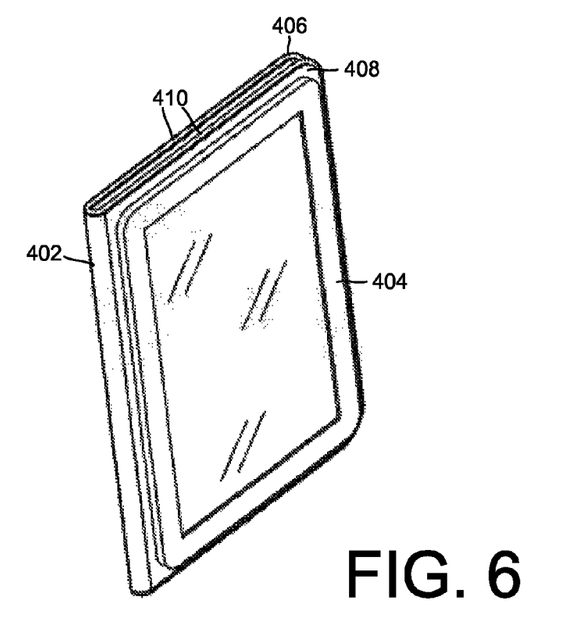

FIGS. 4-6 illustrate another example cover 402 that is configured for use as an accessory to a handheld device 404 such as a tablet device. The cover 402 includes a front flap 406 and a back or back flap 408. The device 404 is detachably attached to the back 408 by means that are not shown.

In this example, the cover 402 has an indicator or indicator portion 410 along the outer edges of the cover 402, including the edges of the front flap 406 and the back flap 408. In some embodiments, the indicator 410 may be formed as a bead or bead-like edge, such as by an tubular or cable-like material that generates and/or emits light. For example, the indicator 410 may comprise a flexible LED or neon lighting string, rope light, or similar type of light or active light generator. Alternatively, the indicator 410 may comprise a passive light emitter, such as a side-emitting optical fiber, fiber optic cable, or other element that emits or radiates a received light signal provided by an light or illumination source. The light or illumination source may be implemented either as part of the cover 402 or as part of the device 404.

FIGS. 4-6 show the front flap 406 of the cover 402 in different positions, illustrating that the indicator 410 is visible from many viewing angles, despite different positions of the front flap 406.

The cover 402 and/or the device 404 may have a signal transmitter, receiver, and/or connector 412 that conveys a mode or indicator signal from the device 404 to the cover 402. In certain embodiments where the indicator 410 is an active or electrically controllable element, the connector 412 may comprise an electrical connector or receiver that conveys an electrical signal such as the mode/color signal 206 of FIG. 2. In other embodiments, where the indicator 410 is a passive element such as a side-emitting optical fiber, the connector 412 may comprise a light receiver or optical connector that conveys a light signal such as the light signal 308 of FIG. 3.

Figure 7:
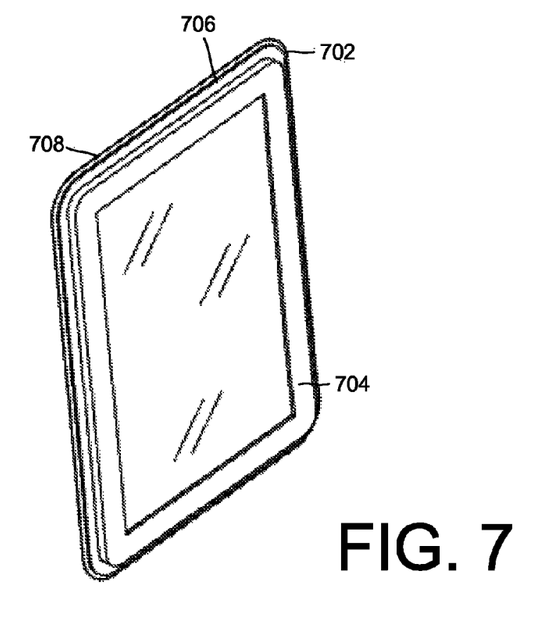
FIG. 7 is a perspective views of a third handheld device and associated cover that indicates conditions or modes of the handheld device.

FIG. 7 illustrates another example cover accessory 702 that is configured for use as an accessory to a handheld device 704 such as a tablet device. The cover 702 in this embodiment includes a back flap or base 706 to which the device 704 is detachably attached. An indicator 708 surrounds the cover 702, extending around its edges. The indicator 708 may be an active light or display component, or may comprise a passive element that receives and radiates light that is generated by an LED or other light source that is part of the device 704 or the cover 702.

Figure 8:
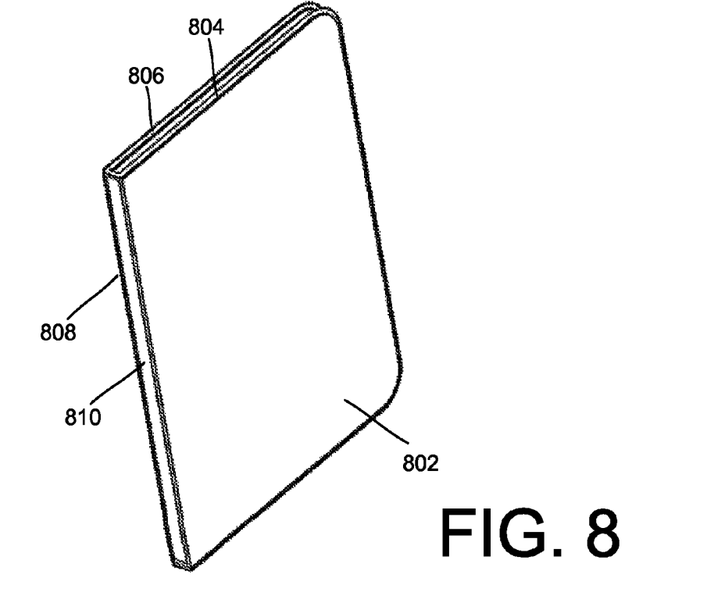
FIG. 8 is a perspective view of a fourth handheld device and associated cover that indicate conditions or modes of the handheld device.

FIG. 8 illustrates another example cover accessory 802 for use with a tablet device or other handheld device. In this embodiment, the cover 802 has front and back flaps 804 and 806 that are configured to close around the tablet device like a book cover. The arrangement forms an outer spine 808 between the front and back flaps 804 and 806. The cover has an indicator 810 that extends along the length of the outer spine 808 of the cover 802 to indicate operating conditions of the enclosed tablet device. As described above, the indicator 810 may comprise an active indicator that generates light, or may comprise a passive indicator that radiates a light signal generated by another source.

Figure 9:
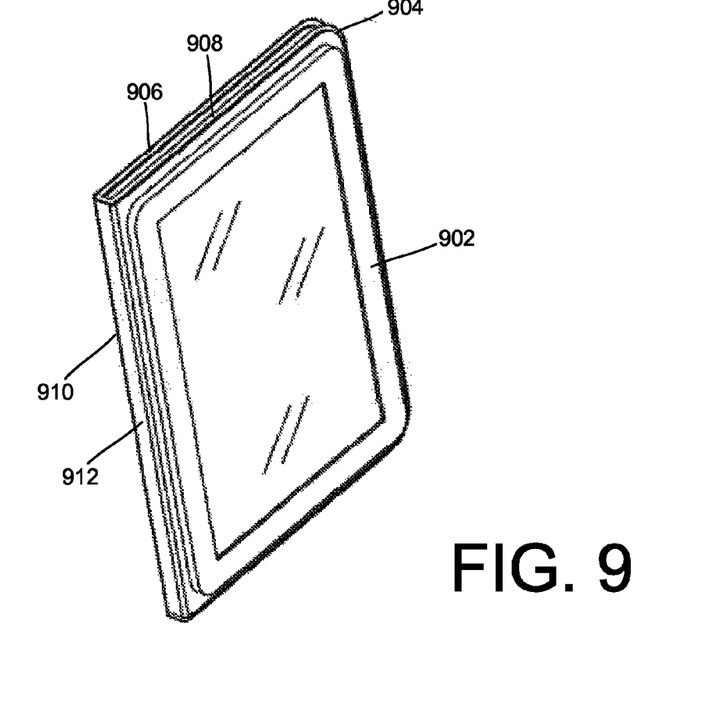
FIG. 9 is a perspective view of a fifth handheld device and associated cover that indicate conditions or modes of the handheld device.

FIG. 9 illustrates yet another embodiment, in which a device 902 is attached to a cover 904. In this example, the cover 904 has a front flap 906 that is folded back around and behind a back flap 908 so that the user may view the tablet device 902. An inner spine 910 is formed between the front flap 906 and the back flap 908. An indicator 912 is positioned long the inner spine 910 so that it is visible when the cover is open. The indicator 912 may comprise either an active display component or a passive light emitter as described above.

Figure 10:
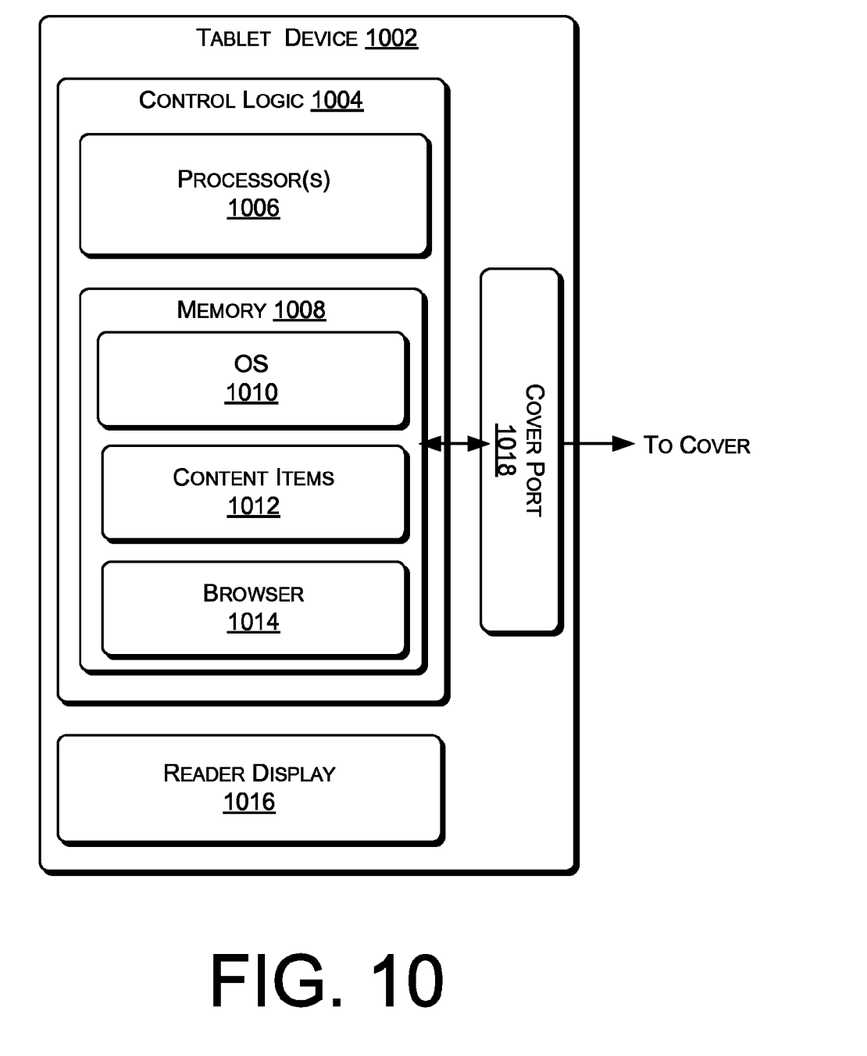
FIG. 10 is a block diagram of a tablet device that may be used in conjunction with the covers described herein.

FIG. 10 shows an example internal or logical configuration of a tablet device 1002 as an example of a handheld device that might be used in conjunction with the covers described above.

The tablet device 1002 has control logic 1004 that may comprise one or more processors 1006 and associated memory 1008. The memory 1008 stores programs or program modules comprising instructions that are executable by the processors 1006 to implement the functionality of the tablet device 1002, including the functionality described herein. The memory 1008 may comprise nonvolatile and/or volatile memory, including RAM, ROM, EEPROM, flash memory, other memory technology, or any other machine-readable storage media. The memory 1008 may include removable and/or non-removable memory.

The memory 1008 may be used to store any number of functional components that are executable on the processor 1006, as well as data and content items that are rendered by the tablet device 1002. Thus, the memory 1008 may store an operating system 1010 and a content-item database to store one or more content items 1012, such as eBooks, movies, songs, or the like. The memory may also store an Internet browser or other network access component 1014, which may be used to access resources and content external to the tablet device 1002.

The operating system 1010 provides menus and other navigational tools to facilitate selection and rendering of the content items 1012. In addition, the operating system 1010 contains logic and modules for controlling a reader display 1016, for rendering visual content items on the reader display 1016, and for navigating through rendered content items in response to user input.

The tablet device 1002 may have various communications ports for configuration and for obtaining content. In this example, the tablet device 102 has a cover port 1018 which is configured to transmit a signal to a cover to indicate an operational condition or mode of the tablet device as described above. The signal may be an optical or light signal, an electrical signal, or a wireless signal. The signal may be generated or controlled by the operating system 1010 or by other executable components of the tablet device 1002.

Although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims.

What is claimed is:

1. A cover for a handheld device, comprising:
   a signal receiver configured to receive a signal from the handheld device, wherein the signal indicates a first user operating mode of at least two user operating modes of the handheld device;
   a visual indicator that is responsive to the signal to display a first visual characteristic of at least two visual characteristics, wherein the first visual characteristic is associated with a first user preference of the first user operating mode and a second visual characteristic of the at least two visual characteristics is associated with a second user preference of a second user operating mode;
   a back flap; and
   a front flap that is attached to the back flap, the front flap being moveable to cover a display surface of the handheld device,
   wherein the visual indicator is at least partly located on one or more edges of the front flap and at least one or more edges of the back flap.

2. The cover of claim 1, wherein the first user operating mode corresponds to at least one of the following:
   a user mode that alters certain functions of the handheld device for a particular user; or
   a mode corresponding to a user characteristic, the visual characteristic indicating or being associated with the user characteristic.

3. The cover of claim 1, wherein the at least two visual characteristics comprise one or more of the following:
   colors;
   patterns; or
   two-dimensional graphical images.

4. The cover of claim 1, wherein the first user operating mode is associated with a first user and the second user operating mode is associated with a second user.

5. The cover of claim 1, wherein:
   the signal comprises a light signal generated by the handheld device; and
   the visual indicator comprises a light-emitting optical guide that receives and emits the light signal.

6. The cover of claim 1, wherein:
   the signal comprises an electrical signal; and the visual indicator comprises one or more light sources that display the visual characteristic in response to the electrical signal.

7. The cover of claim 1, wherein the visual indicator comprises a display panel that is responsive to the signal to display the visual characteristic.

8. The cover of claim 1, wherein the signal comprises one or more of the following:
   a wireless signal;
   an electrical signal; or
   an optical signal.

9. A device accessory, comprising:
   a signal receiver configured to receive a signal from a handheld device, wherein the signal indicates a condition of the handheld device;
   an indicator that is responsive to the signal to present a user-perceivable characteristic of at least two different user-perceivable characteristics, the user-perceivable characteristic corresponding to the condition of the handheld device;
   a back flap configured to attach to the handheld device; and
   a front flap that is attached to the back flap via a hinge, the front flap being moveable via the hinge to cover a display surface of the handheld device, wherein the indicator is at least partly located along one or more edges of the front flap and along one or more edges of the back flap.

10. The device accessory of claim 9, wherein the at least two different user-perceivable characteristics comprise one or more of the following:
    colors;
    patterns;
    haptic indications;
    tactile writing; or
    two-dimensional graphical images.

11. The device accessory of claim 9, wherein:
    the signal receiver is configured to receive an additional signal from an additional handheld device; and
    another user-perceivable characteristic of the at least two different user-perceivable characteristics corresponds to a respective condition of the another handheld device.

12. The device accessory of claim 9, wherein the condition corresponds to at least one of the following:
    an owner of the handheld device;
    a user who is using the handheld device;
    a characteristic of the user who is using the handheld device;
    a user mode that is active on the handheld device;
    a security mode that is active on the handheld device;
    an event notification or reminder generated by the handheld device;
    an activity being performed by the handheld device;
    an application being executed by the handheld device;
    content that is being presented by the handheld device;
    a source that is being accessed by the handheld device;
    a service that is being provided in conjunction with the handheld device;
    awards granted to the user;
    achievements of the user;
    connection status of device peripherals;
    call status; or
    battery level.

13. The device accessory of claim 9, wherein the condition corresponds to a protected mode that restricts access by the handheld device to certain content.

14. The device accessory of claim 9 wherein:
    the signal comprises a light signal generated by the handheld device; and
    the indicator comprises a light-emitting optical guide that receives and emits the light signal.

15. The device accessory of claim 9, wherein:
    the signal comprises an electrical signal; and
    the indicator comprises one or more light sources that presents the user-perceivable characteristic in response to the electrical signal.

16. The device accessory of claim 9, wherein the indicator comprises a display panel that is responsive to the signal to present the user-perceivable characteristic.

17. The device accessory of claim 9, wherein the signal comprises one or more of the following:
    a wireless signal;
    an electrical signal; or
    an optical signal.

18. The cover of claim 1, wherein the visual indicator is located on at least three edges of the front flap and at least three edges of the back flap.

19. The device accessory of claim 9, wherein the indicator is located on at least three edges of the front flap and at least three edges of the back flap.

20. A device accessory, comprising:
    a signal receiver configured to receive a signal from a handheld device, wherein the signal indicates an operating mode of the handheld device;
    an indicator configured to present a perceivable characteristic based at least in part on the operating mode;
    a back flap configured to attach to the handheld device; and
    a front flap that is attached to the back flap,
    wherein the indicator is at least partly located along one or more edges of the front flap and along one or more edges of the back flap.

21. The device accessor of claim 20, wherein the operating modes is associated with a security mode of the handheld device, and wherein the perceivable characteristics includes a light color that indicates the security mode.

22. The device accessor of claim 20, wherein the operating modes is associated with a user mode of the handheld device, and wherein the perceivable characteristics includes a light color that indicates the user mode.

* * * * *